(12) United States Patent
Choi et al.

(10) Patent No.: US 6,623,862 B2
(45) Date of Patent: Sep. 23, 2003

(54) FUNCTIONAL FILM HAVING OPTICAL AND ELECTRICAL PROPERTIES

(75) Inventors: Chaun-gi Choi, Suwon (KR); Young-rag Do, Seoul (KR); Joon-bae Lee, Yongln (KR); Chang-won Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/994,786

(22) Filed: Nov. 28, 2001

(65) Prior Publication Data

US 2002/0187354 A1 Dec. 12, 2002

(30) Foreign Application Priority Data

Feb. 7, 2001 (KR) .......................................... 2001-5938

(51) Int. Cl.[7] .............................................. B32B 17/06
(52) U.S. Cl. ...................... 428/428; 428/432; 428/448; 428/450; 428/697; 428/698; 428/699; 428/701; 428/702
(58) Field of Search ............................... 428/1.51, 1.52, 428/1.62, 428, 432, 448, 450, 469, 472, 697, 699, 698, 701, 702

(56) References Cited

U.S. PATENT DOCUMENTS

| 4,243,735 A | | 1/1981 | Kobale et al. |
|---|---|---|---|
| 4,737,015 A | | 4/1988 | Ishida et al. |
| 4,861,671 A | | 8/1989 | Muchnik et al. |
| 5,668,649 A | * | 9/1997 | Suzuki et al. ................ 349/110 |
| 5,808,714 A | | 9/1998 | Rowlands et al. |
| 5,827,409 A | * | 10/1998 | Iwata et al. ............ 204/192.15 |
| 5,926,239 A | * | 7/1999 | Kumar et al. .................. 349/69 |
| 5,976,639 A | | 11/1999 | Iwata |
| 6,015,323 A | * | 1/2000 | Moradi et al. ................ 445/24 |
| 2001/0016262 A1 | | 8/2001 | Toyoshima et al. |

OTHER PUBLICATIONS

WPI abstract of JP 53037045, Apr. 5, 1978.

U.S. patent application Ser. No. 09/994,623, Choi, et al., filed Nov. 28, 2001.

U.S. patent application Ser. No. 09/994,768, Choi, et al., filed Nov. 28, 2001.

U.S. patent application Ser. No. 09/741,108, Indutnyy et al., filed Dec. 21, 2000.

* cited by examiner

*Primary Examiner*—Deborah Jones
*Assistant Examiner*—Andrew T Piziali
(74) *Attorney, Agent, or Firm*—Staas & Halsey LLP

(57) ABSTRACT

A functional film including a transition layer including a first constituent selected from aluminum and silicon and at least one second constituent selected from oxygen and nitrogen, the first and second constituents having gradual content gradients according to a thickness of the functional film.

27 Claims, 3 Drawing Sheets

FUNCTIONAL FILM HAVING OPTICAL AND ELECTRICAL PROPERTIES

CROSS-REFERENCE TO RELATED APPLICATIONS

This application claims the benefit of Korean Application No. 2001-5938, filed Feb. 7, 2001, in the Korean Industrial Property Office, the disclosure of which is incorporated herein by reference.

BACKGROUND OF THE INVENTION

1. Field of the Invention

The present invention relates to a functional film, and more particularly, to a functional film having adjustable optical and electrical properties and a method of manufacturing the same.

2. Description of the Related Art

A functional film having electrical conductivity while minimizing reflectance of external light has a variety of applications. These applications include use in sun glasses, external light shielding glass, UV protective and insulating materials, and electromagnetic shielding materials. The functional film can also be used as a black matrix formed between phosphor layers of a color display device, such as a color cathode ray tube. In this content, the functional film absorbs both external light and light scattered from adjacent phosphor layer patterns.

Generally, as the reflectance of the external light of a screen of a display device increases, a visible image becomes increasingly blurred. Since the external light is reflected mainly at a black matrix of the screen, attempts to improve the luminance and the contrast by increasing the absorbance of the black matrix surrounding pixels of the display device have been continuously made. Thus, a black matrix is fabricated to have a laminated film structure using chromium, and more specifically, a film structure consisting of a chromium layer and a chromium oxide layer. In order to further increase the absorptivity of the black matrix, carbon is added to the chromium oxide layer.

U.S. Pat. No. 5,976,639 discloses a method of forming a black matrix for a liquid crystal display using a laminated film consisting of a transition layer and a metal layer on the inner surface of a display panel. According to this patent, the laminated film has a transition layer in which the content of one constituent element, such as Cr, W, Ta, Ti, Fe, Ni or Mo, increases approximately between 0.5% and 20% per 100 Å in the incident direction of external light. The transition layer may further include a constituent element such as oxygen (O), nitrogen (N) or carbon (C). The constituent element of the transition layer is desirably chromium. The transition layer is disposed between a low metal layer and a high metal layer. The content of metal elements of the high metal layer is in the range of 50 to 100% by weight, and the content of metal elements of the low metal layer is in the range of 10 to 50% by weight.

However, the black matrix described in U.S. Pat. No. 5,976,639 uses materials that are environmentally detrimental, such as chromium. Also, a highly efficient functional film whose refractive index and electrical conductivity can be adjusted is not disclosed therein.

SUMMARY OF THE INVENTION

To solve the above and other problems, it is an object of the present invention to provide a functional film having good mechanical, optical and electrical properties by using a mixture of nontoxic metal other than chromium and a dielectric material.

Additional objects and advantages of the invention will be set forth in part in the description which follows and, in part, will be obvious from the description, or may be learned by practice of the invention.

To accomplish the above and other objects, a functional film according to an embodiment of the invention includes a transition layer including a first constituent selected from a group consisting of from aluminum (Al) and silicon (Si) and a second constituent selected from a group consisting of oxygen and nitrogen, the first and second constituents having corresponding gradual content gradients that vary according to a thickness of the functional film.

According to an aspect of the present invention, the gradual content gradients are distributed such that a refractive index of the functional film gradually increases or decreases in an incident direction of external light according to the thickness of the functional film.

According to another aspect of the present invention, the gradual content gradients are distributed such that a light absorption efficiency gradually increases in the incident direction of the external light according to the thickness of the functional film.

According to a further aspect of the present invention, the first constituent is aluminum and the gradual content gradients are distributed such that an electrical conductivity gradually increases or decreases according to the thickness of the functional film.

According to yet another aspect of the present invention, the gradual content gradients are distributed such that a content of the first constituent gradually increases and a content of the second constituent gradually decreases in the incident direction of the external light according to the thickness of the functional film.

According to still another aspect of the present invention, the functional film is deposited on a substrate, where a difference in a refractive index at an intersection of the substrate and the functional film is less than or equal to 0.5.

According to another embodiment of the present invention, the functional film further includes a conductive layer consisting of at least one metal constituent selected from the group consisting of titanium (Ti), aluminum (Al), silver (Ag), copper (Cu), gold (Au), platinum (Pt), cobalt (Co), iron (Fe) and indium tin oxide (ITO), and the first constituent forming the functional film having the conductive layer is Si or Al.

According to a yet still further aspect of the present invention, the conductive layer is formed on a face opposite the intersection between the functional film and the substrate when the functional film is used in the fields requesting electrical conductivity characteristics, the first constituent is silicon, and the Si content increases according to the thickness of the functional film.

According to a further embodiment of the present invention, the functional film is used as a black matrix in a display device.

According to a yet further embodiment of the present invention, the functional film further includes a conductive layer used as electrodes of a display device.

BRIEF DESCRIPTION OF THE DRAWINGS

The above and other objects and advantages of the present invention will become more apparent and more readily appreciated by describing in detail preferred embodiments thereof with reference to the accompanying drawings in which.

DETAILED DESCRIPTION OF THE PREFERRED EMBODIMENTS

Figure 1:
FIG. 1 is a schematic diagram illustrating the structure of a functional film according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

As shown in FIG. 1, a laminated film 20 according to an embodiment of the present invention includes a first constituent selected from aluminium (Al) and silicon (Si), and a second constituent selected from oxygen (O) and nitrogen (N). The film 20 is created using a reactive sputtering method to form a transition layer in which the first and second constituents have gradients according to the thickness of the film 20. However, it is understood that other constituents and methods can be used. Further, while the functional film 20 is shown as only being a transition layer, it is understood that additional layers could be added in addition to the transition layer.

The film 20 is coated on a substrate 10. The reflectance (R) of the film 20 is the square of the absolute value of a reflection coefficient (r). The reflection coefficient (r) is generally represented by formula (1):

$$r = \frac{N_s - N_f}{N_s + N_f} = \frac{(n_s - n_f) + i(k_s - k_f)}{(n_s + n_f) + i(k_s + k_f)} \qquad (1)$$

where $N_s$ and $N_f$ denote complex refractive indices, $n_s$ and $n_f$ denote refractive indices, and $k_s$ and $k_f$ denote extinction coefficients of the substrate 10 and the film 20, respectively.

In order to reduce the reflectance of the film 20, it is generally preferable to have a smaller difference in the refractive index between the substrate 10 and the film 20. In other words, as the refractive indices of the substrate 10 and the film 20 become equal, the less reflection occurs.

A film 20 in which only absorption occurs and no reflection occurs can be obtained by gradually varying (increasing or decreasing) the refractive index along a thickness direction of the thickness of the film 20.

Figure 2:
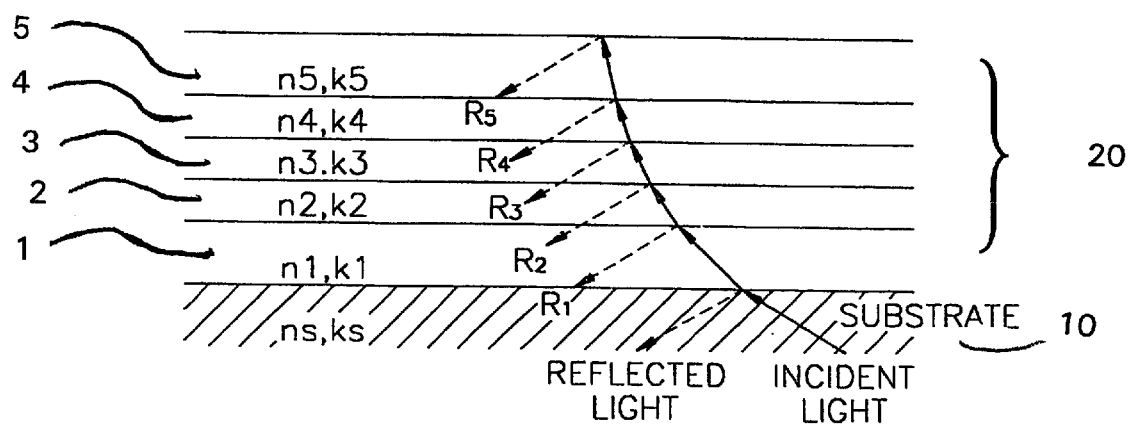
FIG. 2 is a diagram illustrating the principle of a functional film according to another embodiment of the present invention.

As shown in FIG. 2, a first constituent, selected from Al and Si, and a second constituent selected from, O and N, are deposited on a portion adjacent to the substrate 10 by a reactive sputtering method while controlling the deposition rates of the first and second constituents. Accordingly, a dielectric material having a refractive index similar to that of the substrate 10 is deposited on a portion adjacent to the substrate 10.

Here, it is assumed that the refractive index and the extinction coefficient of the substrate are $n_s$ and $k_s$, as noted above, and the refractive index and the extinction coefficient of the first material are $n_1$ and $k_1$. Since there is little difference in the refractive index between the substrate 10 and the first material 1 of the film 20, reflection of light can be almost completely avoided based on the principle represented by formula (1).

Then, a second material 2 (refractive index: $n_2$, extinction coefficient: $k_2$) having substantially the same refractive index as the first material 1 is deposited on the first material 1 by performing the reactive sputtering method while adjusting a ratio of the first constituent content to the second constituent content to reduce the reflectance of light based on the same principle as described above. Next, a third material 3 having a refractive index of $n_3$ and an extinction coefficient of $k_3$, a fourth material 4 having a refractive index of $n_4$ and an extinction coefficient of $k_4$, a fifth material 5 having a refractive index of $n_5$ and an extinction coefficient of $k_5$, and so on, are deposited based on the same principle as described above.

The gradient in the refractive index can be created such that the refractive index gradually increases or decreases. In order to reduce the reflectance of the external light and to increase the light absorption efficiency, the deposition is performed such that the extinction coefficient increases in the incident direction of external light. By letting the extinction coefficient gradually increase according to the thickness of the film 20, the amount of light passing through the film can be made to gradually decrease until no light is transmitted when the thickness reaches a predetermined level.

Also, both the refractive index and the electrical conductivity of the film 20 are made to gradually increase according to the thickness thereof by using Al as the first constituent and by increasing the Al content according to the thickness of the film 20. This minimizes the reflectance of the external light and creates an optical structure having a high electrical conductivity. Such a structure can effectively prevent charge accumulation when it is applied as an electromagnetic shielding material or black matrix of a display device.

Figure 5:
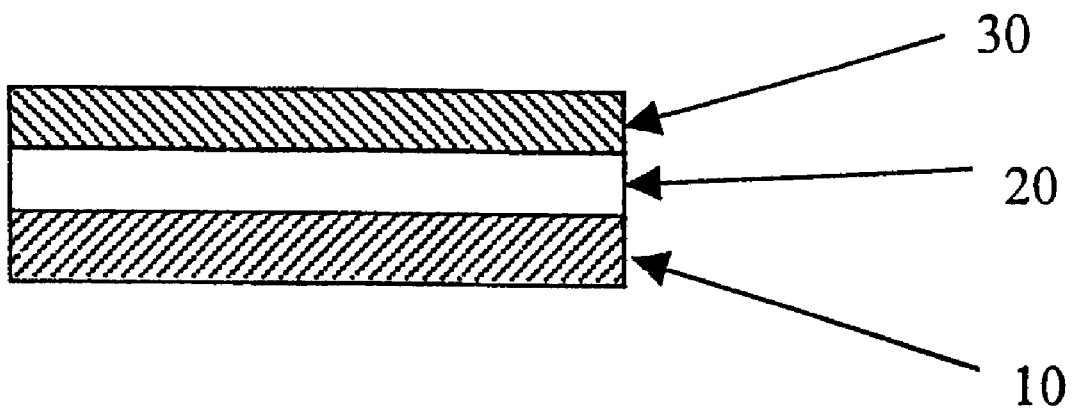
FIG. 5 is the structure of a functional film having a conductive layer according to a further embodiment of the present invention.

As shown in FIG. 5, a conductive layer 30 is further included according to another embodiment of the present invention. If Si is used as the first constituent and the Si content is increased according to the thickness of the film 20, the conductive layer 30 is further formed on the film 20 for the above-described purpose of use. Here, the conductive layer 30 consists of at least one metal constituent selected from the group consisting of titanium (Ti), aluminum (Al), silver (Ag), copper (Cu), gold (Au), platinum (Pt), cobalt (Co), iron (Fe) and indium tin oxide (ITO). However, it is understood that the conductive layer 30 could be used when the first constituent is not Si, and that additional layers can be between the conductive layer 30 and the film 20.

According to the present invention, the film 20 is deposited on the substrate 10 to have a refractive index difference between the substrate 10 and a face of the film 20 contacting the substrate 10 of less than or equal to 0.5. If the difference is greater than 0.5, the reflectance of the film 20 undesirably increases as compared to the substrate 10, particularly if the substrate 10 is a glass substrate.

In the functional film 20, Si or Al is preferably used as the first constituent because its oxide has a property similar to that of glass used as a substrate material.

Also, in the functional film 20 according to an embodiment of the present invention, oxygen or nitrogen is used as the second constituent reacting with the first constituent and sputtered. In other words, Si oxide, Al oxide, Si nitride or Al nitride is preferably used. Deposition is performed with gradual change in the composition ratio of the respective constituents forming the oxide or nitride.

The functional film according to an embodiment of the present invention is manufactured using a reactive sputtering method in the following manner.

Reactive sputtering can be performed by an apparatus comprising a vacuum chamber equipped with a pumping system, a magnetron cathode positioned in the vacuum chamber, a target disposed on the magnetron cathode, such as Si or Al, a first gas inlet system that introduces a gas used in magnetron discharging, a second gas inlet system that introduces a reactive gas to react with a sputtered metal element, such as oxygen or nitrogen gas, and a carrier to transfer a substrate 10 so as to be positioned facing into a discharging space.

The nozzles of the first and second gas inlet systems are opposite each other across the discharging space. Also, the nozzles of the first and second gas inlet systems are placed upstream and downstream of the transferring line of the substrate 10, respectively. In the above-described arrangement, the partial pressure of the reactive gas in the discharging space gradually decreases in the transferring direction of the substrate.

In the case of using both oxygen and nitrogen as the reactive gases, the partial pressure of one reactive gas gradually decreases while the partial pressure of the other gas gradually increases.

Figure 3:
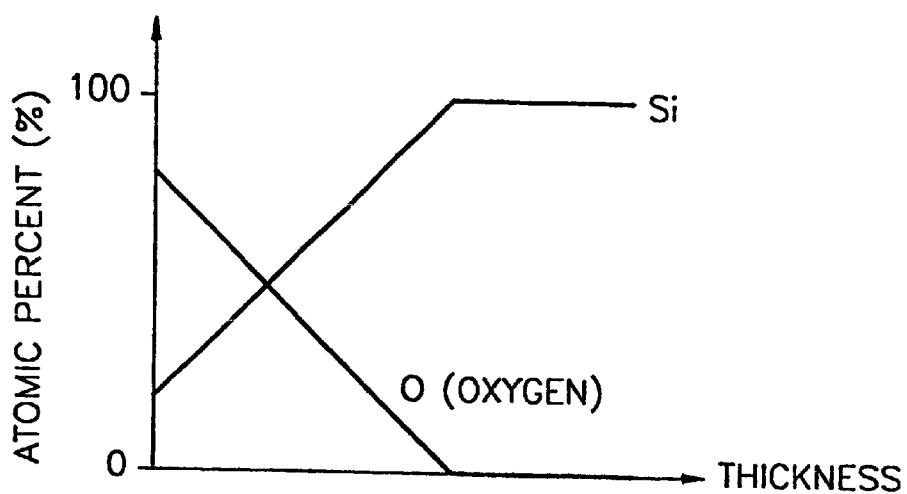
FIG. 3 is a diagram illustrating a change in the distribution of silicon (Si) and oxygen (O) constituents of a functional film according to yet another embodiment of the present invention.

According to another embodiment of the present invention, the functional film 20 includes Si oxide ($SiO_x$) or Si nitride ($SiN_x$). In the case of depositing Si oxide on a soda-lime glass substrate 10, Si is used as a target and oxygen ($O_2$) is used as a second gas, which is a reactive gas. The partial pressure of the second gas is adjusted such that the $SiO_2$, whose refractive index is similar to that of the soda-lime glass substrate 10, is deposited on the substrate 10 at an initial stage of the deposition. The partial pressure of the $O_2$ gradually decreases according to the progress of the deposition such that only the Si is deposited at a final stage of the deposition. FIG. 3 schematically shows a compositional change with an increase of the film 20 thickness.

According to another aspect of the present invention, there is provided a functional film having conductivity created by depositing an Si layer, and then depositing a metal layer using at least one metal target selected from the group consisting of Ti, Al, Ag, Cu, Au, Pt, Co, Fe and ITO or alloys thereof as a target of the sputtering apparatus. The functional film having a metal conductive layer can be applied to an electrode of a plasma display panel (PDP), a black matrix of a variety of display devices, and so on.

Alternatively, the present invention provides a functional film 20 having an Al oxide or nitride. In the case of depositing an Al oxide, Al is used as a target and oxygen ($O_2$) or nitrogen ($N_2$) is used as the second gas, which is a reactive gas. The subsequent deposition process is otherwise the same as the case of Si.

Figure 4:
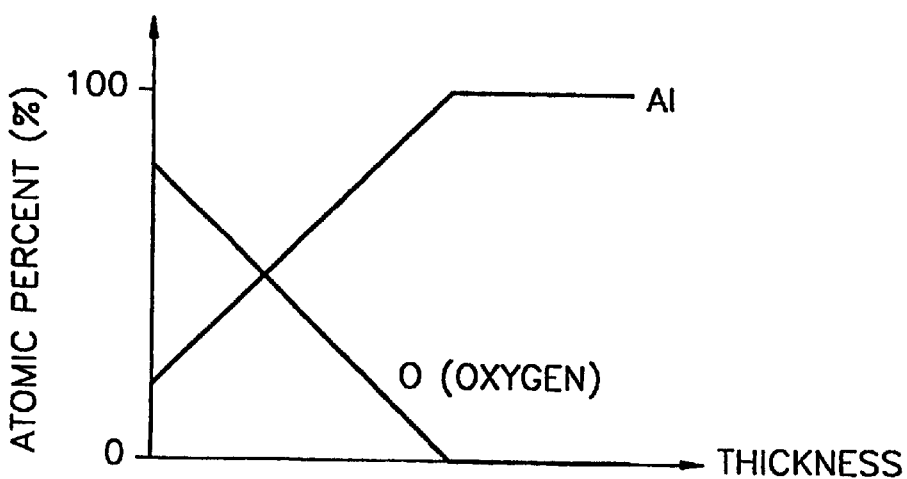
FIG. 4 is a diagram illustrating a change in the distribution of aluminum (Al) and oxygen (O) constituents of a functional film according to still another embodiment of the present invention.

In the case of using Al as a target, an Al oxide or nitride layer is obtained at an initial stage, and an Al layer is obtained at the final stage. Since Al itself is a metal, it can be directly used for a variety of applications in which a conductive film is required without separately forming a metal conductive layer 30. FIG. 4 schematically shows a compositional change with change in the film thickness in the case of depositing Al oxide. In the case of a soda-lime substrate 10, the content ratio of aluminum to oxygen is preferably 2:3 to make the refractive indices of the substrate 10 and the initial-stage film 20 almost the same.

FIGS. 3 and 4 show cases in which compositions of the targets vary linearly. However, it is understood that the present invention is not limited thereto, and the deposition may be performed so as to have a stepped gradient. In addition, if radio-frequency (RF) or direct-current (DC) power applied to each target increases or decreases linearly, a linear content gradient is created, as shown in FIGS. 3 and 4. Alternatively, a functional film 20 having a stepped gradient can also be obtained by gradually applying predetermined RF or DC power to a target.

The present invention will now be described in detail through the following examples. However, it is understood that the present invention is not limited to the examples.

EXAMPLE 1

Silicon (Si) as a target and oxygen ($O_2$) as a reactive gas were deposited on a soda-lime glass substrate using a reactive sputtering apparatus while gradually decreasing the partial pressure of oxygen such that the Si and the $O_2$ have corresponding content gradients that vary with respect to the thickness of the film. The atomic ratio of the silicon to the oxygen was adjusted to be 1:2 at an initial stage of the deposition, and the partial pressure of $O_2$ was gradually decreased until only Si was deposited when the thickness of the film reached 1500 Å. When the total thickness of the film was 2000 Å, a 1000 Å thick conductive layer was further formed using a silver (Ag) target.

EXAMPLE 2

A functional film was manufactured in the same manner as in Example 1, except that a film was formed using both oxygen and nitrogen as reactive gases.

EXAMPLE 3

A functional film was manufactured in the same manner as in Example 1, except that an Al target was used instead of an Si target and that a separate step of forming a conductive layer was not performed. Also, the atomic ratio of aluminum to oxygen was adjusted to be approximately 2:3 at an initial stage of deposition.

Electric and optical properties of the black matrixes manufactured in Examples 1 through 3 were evaluated and the evaluation results are summarized in Table 1. In Table 1, the reflectance and the optical density were measured at a wavelength of 550 nm using a UV-visible ray spectrometer, and the sheet resistance Rs was measured by a 4-point probe method.

TABLE 1

| | Constituent elements | Rs (mΩ/□) | Reflectance (550 nm, %) | Optical density | Thickness (Å) |
|---|---|---|---|---|---|
| Example 1 | Si/O/Ag | 240 | 0.05 | 4.5 | 3000 |
| Example 2 | Si/N/O/Ag | 210 | 0.2 | 4.2 | 3300 |
| Example 3 | Al/O | 352 | 0.5 | 4.6 | 3500 |

From Table 1, it was understood that the functional films according to Examples 1 through 3 had good reflectance, sheet resistance and optical density. Specifically, the functional films exhibited a sheet resistance of 200 to 350 mΩ/□ a reflectance of 0.5 or less, and an optical density of 4.0 or greater.

In the functional film according to the present invention, in order to greatly reduce the reflectance of the film, the refractive index of the film can be easily adjusted to be substantially the same as that of a substrate. Also, by gradually varying the refractive index of the film as a function of depth, the film can be finally provided with desired electrical properties so that the film has both a light absorption layer and a conductive layer. Therefore, the functional film according to the present invention can be used for a variety of applications in which both optical properties and electrical properties are required.

While this invention has been particularly shown and described with reference to preferred embodiments thereof, it will be understood by those skilled in the art that various changes in form and details may be made therein without departing from the spirit and scope of the invention as defined by the accompanying claims and equivalents thereof.

What is claimed is:

1. A functional film disposed on a surface, the film comprising:
    a transition layer comprising:
        a first constituent comprising at least one material selected from aluminum and silicon; and
        a second constituent comprising nitrogen,
    wherein the first and second constituents have corresponding and inverse gradual content gradients that vary according to a thickness of said transition layer.

2. The functional film according to claim 1, wherein the gradual content gradients are distributed such that a refractive index of the functional film gradually increases or decreases in an incident direction of external light according to the thickness of said transition layer.

3. The functional film according to claim 1, wherein the gradual content gradients are distributed such that a light absorption efficiency gradually increases in an incident direction of external light according to the thickness of said transition layer.

4. The functional film according to claim 1, wherein the gradual content gradients are distributed such that a content of the first constituent gradually increases and a content of the second constituent gradually decreases in an incident direction of external light according to the thickness of said transition layer.

5. The functional film according to claim 1, further comprising a substrate having the surface on which the functional film is deposited, wherein a difference in a refractive index at an intersection between said transition layer and said substrate is less than or equal to 0.5.

6. The functional film according to claim 1, further comprising a conductive layer consisting of at least one constituent selected from the group consisting of titanium, aluminum, silver, copper, gold, platinum, cobalt, iron and indium tin oxide.

7. The functional film according to claim 6, further comprising a substrate on which said transition layer is deposited, wherein the first constituent comprises silicon and said conductive layer is formed on a face opposite an intersection between said transition layer and said substrate.

8. The functional film according to claim 5, further comprising a conductive layer consisting of at least one constituent selected from the group consisting of titanium, aluminum, silver, copper, gold, platinum, cobalt, iron and indium tin oxide.

9. The functional film according to claim 8, wherein the first constituent is silicon and said conductive layer is formed on a face opposite the intersection of said transition layer and said substrate.

10. A functional film disposed on a surface for use in a display, the film comprising:
    a first constituent comprising one of aluminum and silicon; and
    a second constituent comprising nitrogen,
    wherein contents of said first and second constituents vary within the functional film such that light incident on a first face of the functional film is variably refracted and does not pass through a second face of the functional film opposite the first face.

11. The functional film of claim 10, wherein the contents of said first and second constituents vary as a function of distance from the first face.

12. The functional film of claim 11, wherein the function is a linear function.

13. The functional film of claim 10, further comprising layers disposed between the first and second faces, with each said layer having a corresponding relative content of said first and second constituents that is constant through said layer.

14. A functional film disposed on a surface for use in a display, the film comprising:
    a first constituent comprising one of aluminum and silicon; and
    a second constituent comprising one of oxygen and nitrogen,
    wherein contents of said first and second constituents vary within the functional film such that light incident on a first face of the functional film is variably refracted and does not pass through a second face of the functional film opposite the first face, and
    wherein said second constituent further comprises the other one of oxygen and the nitrogen.

15. The functional film of claim 10, wherein the first face has a refractive index that is at or within 0.5 of a refractive index of glass.

16. The functional film of claim 15, wherein the glass is soda-lime glass.

17. The functional film of claim 10, further comprising a conductive layer deposited on the functional film above the second face.

18. The functional film according to claim 17, wherein said conductive layer consists of at least one constituent selected from the group consisting of titanium, aluminum, silver, copper, gold, platinum, cobalt, iron and indium tin oxide.

19. The functional film of claim 10, wherein a refractive index of the functional film gradually changes as a function of a distance from the first face.

20. The functional film of claim 19, wherein a light absorption efficiency gradually increases as a function of the distance from the first face.

21. The functional film of claim 20, wherein an extinction coefficient gradually increases as a function of the distance from the first face.

22. The functional film according to claim 1, wherein the first constituent comprises the silicon.

23. The functional film according to claim 1, further comprising a third constituent comprising oxygen,
    wherein the third constituent has a corresponding gradual content gradient that varies according to the thickness of said transition layer.

24. The functional film according to claim 23, wherein the gradual content gradients are distributed such that a content of the first constituent gradually increases and a content of the second and third constituents gradually decrease in an incident direction of external light according to the thickness of said transition layer.

25. A functional film disposed on a surface, the film comprising:
   a transition layer comprising:
      a first constituent comprising at least one material selected from aluminum and silicon; and
      a second constituent comprising oxygen and nitrogen; and
   a conductive layer consisting of at least one constituent selected from the group consisting of titanium, silver, copper, gold, platinum, cobalt, and iron,
   wherein the first and second constituents have corresponding and inverse gradual content gradients that vary according to a thickness of said transition layer.

26. The functional film according to claim 25, wherein the gradual content gradients are distributed such that a refractive index of the functional film gradually increases or decreases in an incident direction of external light according to the thickness of said transition layer.

27. The functional film according to claim 25, wherein the gradual content gradients are distributed such that a light absorption efficiency gradually increases in an incident direction of external light according to the thickness of said transition layer.

* * * * *